US010497797B2

(12) United States Patent
Huang et al.

(10) Patent No.: US 10,497,797 B2
(45) Date of Patent: Dec. 3, 2019

(54) SEMICONDUCTOR STRUCTURE AND MANUFACTURING METHOD THEREOF

(71) Applicant: UNITED MICROELECTRONICS CORP., Hsin-Chu (TW)

(72) Inventors: Shih-Hsien Huang, Kaohsiung (TW); Chien-Hung Chen, Hsinchu County (TW); Chun-Yuan Wu, Yun-Lin County (TW); Kun-Hsin Chen, Pingtung County (TW); Tien-I Wu, Taoyuan (TW); Yu-Ru Yang, Hsinchu County (TW); Huai-Tzu Chiang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/941,674

(22) Filed: Nov. 16, 2015

(65) Prior Publication Data
US 2017/0117414 A1   Apr. 27, 2017

(30) Foreign Application Priority Data

Oct. 26, 2015   (CN) .......................... 2015 1 0700127

(51) Int. Cl.
*H01L 29/78* (2006.01)
*H01L 29/06* (2006.01)
(Continued)

(52) U.S. Cl.
CPC ...... *H01L 29/66795* (2013.01); *H01L 21/324* (2013.01); *H01L 29/0649* (2013.01);
(Continued)

(58) Field of Classification Search
CPC ......... H01L 21/02381; H01L 21/02647; H01L 21/02532; H01L 21/02521; H01L 21/0245; H01L 21/02636; H01L 21/28255; H01L 21/0251; H01L 21/02573; H01L 21/02513; H01L 21/02645; H01L 21/02694; H01L 21/02598; H01L 21/02236; H01L 21/02524; H01L 29/16; H01L 29/267; H01L 29/66462; H01L 29/882;
(Continued)

(56) References Cited

U.S. PATENT DOCUMENTS 7,777,250 B2 *  8/2010  Lochtefeld .......... H01L 21/2018
                                                              257/190
7,799,592 B2    9/2010  Lochtefeld
                  (Continued)

*Primary Examiner* — Sophia T Nguyen
(74) *Attorney, Agent, or Firm* — Winston Hsu

(57) ABSTRACT

A semiconductor structure including a semiconductor substrate and at least a fin structure formed thereon. The semiconductor substrate includes a first semiconductor material. The fin structure includes a first epitaxial layer and a second epitaxial layer formed between the first epitaxial layer and the semiconductor substrate. The first epitaxial layer includes the first semiconductor material and a second semiconductor material. A lattice constant of the second semiconductor material is different from a lattice constant of the first semiconductor material. The second epitaxial layer includes the first semiconductor material and the second semiconductor material. The second epitaxial layer further includes conductive dopants.

6 Claims, 8 Drawing Sheets

(51) Int. Cl.
*H01L 29/10* (2006.01)
*H01L 29/165* (2006.01)
*H01L 29/167* (2006.01)
*H01L 29/66* (2006.01)
*H01L 21/324* (2006.01)
*H01L 21/8234* (2006.01)

(52) U.S. Cl.
CPC ...... *H01L 29/1054* (2013.01); *H01L 29/1083* (2013.01); *H01L 29/165* (2013.01); *H01L 29/167* (2013.01); *H01L 29/785* (2013.01); H01L 21/823412 (2013.01); H01L 21/823431 (2013.01); *H01L 29/7851* (2013.01); *H01L 2029/7858* (2013.01); H01L 2924/13067 (2013.01)

(58) Field of Classification Search
CPC ............ H01L 29/66666; H01L 29/778; H01L 29/7827; H01L 29/7848; H01L 29/78687; H01L 29/32; H01L 29/0607; H01L 29/6609; H01L 29/66431; H01L 29/0895; H01L 29/36; H01L 29/737; H01L 33/12; H01L 31/0304; H01L 31/031; H01L 29/0649; H01L 29/1054; H01L 29/167; H01L 29/66795; H01L 29/7851; 2029/7858; H01L 29/785; H01L 21/823431; H01L 21/823412; H01L 21/324; H01L 2924/13067; H01L 21/823807; H01L 21/823878; H01L 21/02499; H01L 21/02502; H01L 21/02576; H01L 21/02581; H01L 21/02653; H01L 21/02639; H01L 21/2018; H01L 29/165; H01L 29/1083; H01L 29/0619; H01L 29/0684; H01L 29/42376

See application file for complete search history.

(56) References Cited

U.S. PATENT DOCUMENTS

| | | | | |
|---|---|---|---|---|
| 8,367,498 B2* | 2/2013 | Chang | H01L 29/7848 | 257/E21.409 |
| 8,420,459 B1* | 4/2013 | Cheng | H01L 29/66477 | 257/E21.32 |
| 8,497,171 B1* | 7/2013 | Wu | H01L 21/823821 | 438/199 |
| 8,610,201 B1* | 12/2013 | Hokazono | H01L 21/823821 | 257/328 |
| 8,673,718 B2* | 3/2014 | Maszara | H01L 29/66795 | 438/268 |
| 8,680,576 B2* | 3/2014 | Ching | H01L 21/823807 | 257/190 |
| 8,748,940 B1* | 6/2014 | Rachmady | H01L 29/66742 | 257/190 |
| 8,815,691 B2* | 8/2014 | Colinge | H01L 29/785 | 257/E29.262 |
| 8,823,060 B1* | 9/2014 | Colinge | H01L 29/66795 | 257/192 |
| 8,836,016 B2* | 9/2014 | Wu | H01L 29/66795 | 257/329 |
| 8,841,701 B2* | 9/2014 | Lin | H01L 29/7853 | 257/192 |
| 9,006,786 B2* | 4/2015 | Ching | H01L 29/7856 | 257/190 |
| 9,070,771 B2* | 6/2015 | Reznicek | H01L 21/823821 | |
| 9,159,824 B2* | 10/2015 | Lee | H01L 29/66431 | |
| 9,190,417 B2* | 11/2015 | Chang | H01L 29/7848 | |
| 9,202,917 B2* | 12/2015 | Ching | H01L 29/785 | |
| 9,275,905 B1* | 3/2016 | Wen | H01L 21/845 | |
| 9,306,069 B2* | 4/2016 | Ching | H01L 29/7842 | |
| 9,318,621 B2* | 4/2016 | Chang | H01L 29/861 | |
| 9,391,078 B1* | 7/2016 | Liu | H01L 27/0924 | |
| 9,425,313 B1* | 8/2016 | Chen | H01L 29/7849 | |
| 9,502,560 B2* | 11/2016 | Zhu | H01L 29/66795 | |
| 9,524,909 B2* | 12/2016 | Huang | H01L 21/823431 | |
| 9,524,987 B2* | 12/2016 | Hsu | H01L 27/1211 | |
| 9,583,623 B2* | 2/2017 | Fung | H01L 29/7849 | |
| 9,595,599 B1* | 3/2017 | Bu | H01L 29/6681 | |
| 9,748,142 B2* | 8/2017 | Lee | H01L 21/82341 | |
| 9,748,143 B2* | 8/2017 | Lee | H01L 29/785 | |
| 9,847,333 B2* | 12/2017 | Lim | H01L 27/0924 | |
| 9,871,038 B2* | 1/2018 | Wang | H01L 29/1054 | |
| 9,911,735 B2* | 3/2018 | Chang | H01L 29/7848 | |
| 9,953,836 B2* | 4/2018 | Wen | H01L 21/845 | |
| 9,954,107 B2* | 4/2018 | Cheng | H01L 29/7851 | |
| 2005/0164475 A1* | 7/2005 | Peckerar | C30B 25/04 | 438/492 |
| 2007/0065671 A1* | 3/2007 | Li | H01L 21/2205 | 428/446 |
| 2007/0187716 A1* | 8/2007 | Chu | H01L 21/823807 | 257/192 |
| 2008/0073641 A1* | 3/2008 | Cheng | B82Y 10/00 | 257/25 |
| 2009/0001420 A1* | 1/2009 | Matsumoto | H01L 21/823807 | 257/190 |
| 2009/0224357 A1* | 9/2009 | Juengling | H01L 29/66545 | 257/506 |
| 2010/0301390 A1* | 12/2010 | Ko | H01L 29/7851 | 257/190 |
| 2011/0147711 A1* | 6/2011 | Pillarisetty | B82Y 10/00 | 257/24 |
| 2011/0156005 A1* | 6/2011 | Pillarisetty | H01L 29/165 | 257/24 |
| 2012/0104472 A1* | 5/2012 | Xu | H01L 29/66795 | 257/288 |
| 2012/0319211 A1* | 12/2012 | van Dal | H01L 29/66795 | 257/401 |
| 2013/0011983 A1* | 1/2013 | Tsai | H01L 21/823807 | 438/285 |
| 2013/0161756 A1* | 6/2013 | Glass | H01L 29/66545 | 257/369 |
| 2013/0175659 A1* | 7/2013 | Liu | H01L 29/66795 | 257/506 |
| 2013/0270638 A1* | 10/2013 | Adam | H01L 29/66795 | 257/347 |
| 2014/0008700 A1* | 1/2014 | Rachmady | H01L 29/66431 | 257/192 |
| 2014/0054679 A1* | 2/2014 | Tang | H01L 21/26586 | 257/329 |
| 2014/0065802 A1* | 3/2014 | Chang | H01L 21/845 | 438/479 |
| 2014/0159126 A1* | 6/2014 | Wei | H01L 29/66795 | 257/288 |
| 2014/0239402 A1* | 8/2014 | Lee | H01L 29/785 | 257/368 |
| 2014/0264592 A1* | 9/2014 | Oxland | H01L 29/785 | 257/347 |
| 2014/0353767 A1* | 12/2014 | Liu | H01L 21/845 | 257/401 |
| 2015/0028349 A1* | 1/2015 | Loubet | H01L 29/7848 | 257/77 |
| 2015/0054040 A1* | 2/2015 | Lee | H01L 21/823412 | 257/288 |
| 2015/0076514 A1* | 3/2015 | Morin | H01L 29/7843 | 257/77 |
| 2015/0187773 A1* | 7/2015 | Niimi | H01L 21/823807 | 257/369 |
| 2015/0214333 A1* | 7/2015 | Colinge | H01L 29/7843 | 438/157 |
| 2015/0249153 A1* | 9/2015 | Morin | H01L 29/785 | 257/192 |
| 2015/0255456 A1* | 9/2015 | Jacob | H01L 27/0886 | 257/401 |
| 2015/0255545 A1* | 9/2015 | Holland | H01L 29/66795 | 257/288 |

(56) References Cited

U.S. PATENT DOCUMENTS

| | | | |
|---|---|---|---|
| 2015/0263159 A1* | 9/2015 | Ching | H01L 29/785 257/77 |
| 2015/0279973 A1* | 10/2015 | Akarvardar | H01L 29/1054 438/283 |
| 2015/0295087 A1* | 10/2015 | Cheng | H01L 29/7851 257/192 |
| 2015/0311341 A1* | 10/2015 | Hur | H01L 21/02532 257/190 |
| 2015/0318176 A1* | 11/2015 | Qi | H01L 29/6681 438/283 |
| 2015/0325436 A1* | 11/2015 | Bentley | H01L 29/66 257/401 |
| 2015/0372084 A1* | 12/2015 | Qi | H01L 29/0692 257/506 |
| 2016/0027779 A1* | 1/2016 | Loo | H01L 29/165 257/190 |
| 2016/0071979 A1* | 3/2016 | Jacob | H01L 29/66803 257/401 |
| 2016/0086858 A1* | 3/2016 | Cheng | H01L 21/823821 257/618 |
| 2016/0087062 A1* | 3/2016 | Yin | H01L 29/4916 257/344 |
| 2016/0126086 A1* | 5/2016 | Cheng | H01L 21/0259 257/506 |
| 2016/0197004 A1* | 7/2016 | Akarvardar | H01L 21/76202 257/509 |
| 2016/0225673 A1* | 8/2016 | Niimi | H01L 21/823807 438/222 |
| 2016/0225674 A1* | 8/2016 | Jacob | H01L 21/823821 |
| 2016/0225676 A1* | 8/2016 | Jacob | H01L 21/845 |
| 2016/0329326 A1* | 11/2016 | Balakrishnan | H01L 27/0886 |
| 2016/0343623 A1* | 11/2016 | Fogel | H01L 21/82387 |
| 2016/0379981 A1* | 12/2016 | Balakrishnan | H01L 27/0924 257/192 |
| 2017/0012100 A1* | 1/2017 | Leobandung | H01L 29/1083 |
| 2017/0033181 A1* | 2/2017 | McArdle | H01L 29/1054 |
| 2017/0084723 A1* | 3/2017 | Greene | H01L 29/7856 |
| 2017/0098692 A1* | 4/2017 | Chiang | H01L 29/0615 |
| 2017/0104070 A1* | 4/2017 | Chen | H01L 21/02532 |
| 2017/0117364 A1* | 4/2017 | Ching | H01L 29/785 |
| 2017/0117414 A1* | 4/2017 | Huang | H01L 21/324 |
| 2017/0141189 A1* | 5/2017 | Chang | H01L 29/1083 |
| 2017/0162653 A1* | 6/2017 | Rachmady | H01L 29/66431 |
| 2017/0186598 A1* | 6/2017 | Goel | H01L 21/0245 |
| 2017/0200721 A1* | 7/2017 | Chen | H01L 27/0928 |
| 2017/0207323 A1* | 7/2017 | Basker | H01L 29/66795 |
| 2017/0250182 A1* | 8/2017 | Goel | H01L 27/0886 |
| 2017/0301589 A1* | 10/2017 | Jacob | H01L 21/823821 |
| 2017/0309768 A1* | 10/2017 | Hekmatshoar-Tabari | H01L 21/02543 |
| 2017/0352596 A1* | 12/2017 | Lee | H01L 29/785 |
| 2017/0358648 A1* | 12/2017 | Van Dal | H01L 29/66795 |
| 2018/0033873 A1* | 2/2018 | Yan | H01L 29/66795 |
| 2018/0047839 A1* | 2/2018 | Pillarisetty | B82Y 10/00 |
| 2018/0122946 A1* | 5/2018 | Holland | H01L 21/76 |
| 2018/0204947 A1* | 7/2018 | Rachmady | H01L 29/66545 |
| 2018/0248028 A1* | 8/2018 | Mohapatra | H01L 29/785 |

* cited by examiner

SEMICONDUCTOR STRUCTURE AND MANUFACTURING METHOD THEREOF

BACKGROUND OF THE INVENTION

1. Field of the Invention

The present invention relates to a semiconductor structure and manufacturing method thereof, and more particularly, to a semiconductor fin structure and manufacturing method thereof.

2. Description of the Prior Art

Epitaxial structures are prevalently used in a wide variety of semiconductor applications. For example, the prior art usually forms an epitaxial layer such as an epitaxial silicon germanium (hereinafter abbreviated as SiGe) layer in a single crystal substrate by performing a selective epitaxial growth (hereinafter abbreviated as SEG) method. Because the lattice constant of the epitaxial SiGe layer is larger than that of the silicon substrate, a strain stress is generated to the meta-oxide semiconductor (hereinafter abbreviated as MOS) transistor device. Accordingly, carrier mobility in the channel region is improved and the speed of the MOS transistor device is increased.

Although the epitaxial structures efficiently improve device performance, it increases complexity of the semiconductor fabrication and difficulties of process control. For example, though higher Ge concentration in the epitaxial SiGe layer improves device performances, dislocation defects usually occur in the higher Ge concentration and/or thicker epitaxial SiGe layer due to the lattice mismatch between the materials. The dislocation defect unwantedly reduces the strain stress. Therefore, it is getting more and more difficult to design and fabricate semiconductor devices having epitaxial structures.

Accordingly, though the epitaxial structure is able to improve the device performance, it is always in need to provide semiconductor devices as expected when the progress of semiconductor manufacturing technology is improved and complexity of the products is increased.

SUMMARY OF THE INVENTION

According to an aspect of the present invention, a semiconductor structure is provided. The semiconductor structure includes a semiconductor substrate, and at least a fin formed on the semiconductor substrate. The semiconductor substrate includes a first semiconductor material. The fin includes a first epitaxial layer and a second epitaxial layer formed between the first epitaxial layer and the semiconductor substrate. The first epitaxial layer includes the first semiconductor material and a second semiconductor material, and a lattice constant of the second semiconductor material is different from a lattice constant of the first semiconductor material. The second epitaxial layer includes the first semiconductor material and the second semiconductor material. The second epitaxial layer further includes conductive dopants.

According to an aspect of the present invention, a method for manufacturing a semiconductor structure is provided. The method includes following steps. A semiconductor substrate is provided, and the semiconductor substrate includes a first semiconductor material. A dielectric structure is formed on the semiconductor substrate, and the dielectric structure includes a recess formed therein. A second epitaxial layer is then formed in the recess, the second epitaxial layer includes the first semiconductor material and a second semiconductor material, and a lattice constant of the second semiconductor material is different from a lattice constant of the first semiconductor material. The second epitaxial layer further includes conductive dopants. Next, a first epitaxial layer is formed on the second epitaxial layer. The first epitaxial layer includes the first semiconductor material and the second semiconductor material. The first epitaxial layer is an undoped epitaxial layer. After forming the first epitaxial layer, a portion of dielectric structure is removed to form a fin on the semiconductor substrate.

According to the semiconductor structure and the manufacturing method thereof provided by the present invention, at least a second epitaxial layer is formed before forming the first epitaxial layer, which serves as the main stress provider. The second epitaxial layer further includes the conductive dopants of which the conductivity type is complementary to the transistor device to be formed. Consequently, the second epitaxial layer serves as an anti-punch through (APT) layer. Briefly speaking, according to the semiconductor structure and the manufacturing method thereof provided by the present invention, the first epitaxial layer is provided to render stress to the transistor device and the second epitaxial layer is provided to avoid punch through effect. Therefore the performance of the transistor device including the first epitaxial layer and the second epitaxial layer is efficaciously improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic drawings illustrating a method for manufacturing a semiconductor structure provided by a preferred embodiment of the present invention, wherein FIG. 2 is a schematic drawing illustrating a modification the present invention, FIG. 3 is a schematic drawing in a step subsequent to FIG. 1 and/or FIG. 2, FIG. 4 is a schematic drawing another modification the present invention, FIG. 5 is a schematic drawing in a step subsequent to FIG. 3 and/or FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

DETAILED DESCRIPTION

Figure 1:
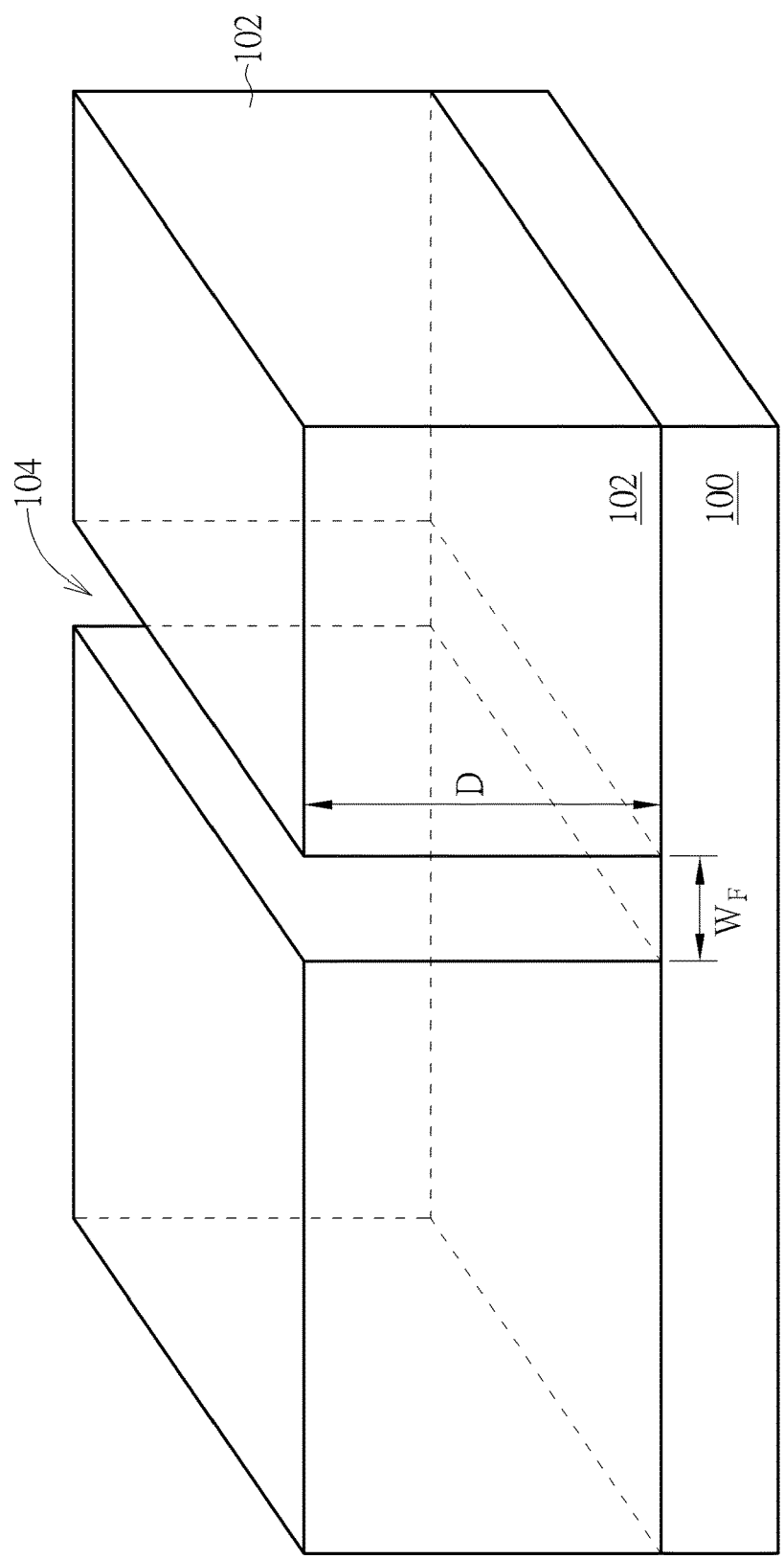

Please refer to FIGS. 1-8, which are schematic drawings illustrating a method for manufacturing a semiconductor structure provided by a preferred embodiment of the present invention. As shown in FIG. 1, a semiconductor substrate 100 is provided by the method. The semiconductor substrate 100 includes a first semiconductor material, and the first semiconductor material may be, for example but not limited to, silicon (Si), germanium (Ge), III-V compound, or II-VI compound. In some embodiments the first semiconductor material preferably includes Si, but not limited to this. Additionally, the semiconductor substrate 100 can be bulk Si substrate with (100) crystal plane. Next, a dielectric structure 102 is formed on the semiconductor substrate 100. The dielectric structure 102 can be formed by any suitable process such as shallow trench isolation (hereinafter abbreviated as STI) fabricating process. Generally speaking, a pad layer (not shown) and a hard mask layer (not shown) are formed on the semiconductor substrate 100 and followed by patterning. The patterned hard mask layer and pad layer are used to define place and width of fin(s) to be formed, but not limited to this. Next, the semiconductor substrate 100 is etched with the patterned hard mask layer and pad layer serving as etching mask, and thus a plurality of trenches (not shown) is formed in the semiconductor substrate. Subsequently, an insulating material is formed to fill up the trenches.

Next, a planarization process is performed to remove superfluous insulating material and the patterned hard mask layer/pad layer. Consequently, a plurality of STI is formed on the semiconductor substrate 100, and those STIs are taken as the dielectric structure 102 in the preferred embodiment of the present invention. A dry etching process is then performed to remove the semiconductor substrate 100 formed in between the STI 102, and thus at least a recess 104 is formed in the dielectric structure 102. According to the preferred embodiment, a bottom of the recess 104 is coplanar with a bottom of the dielectric structure 102 as shown in FIG. 1. Furthermore, the recess 104 includes a width $W_F$ and a depth D. The width $W_F$ of the recess 104 is equal to a width of the fins to be formed. In some embodiments of the present invention, the depth D of the recess 104 can be between 100 nanometers (nm) and 300 nm, but not limited to this.

Figure 2:
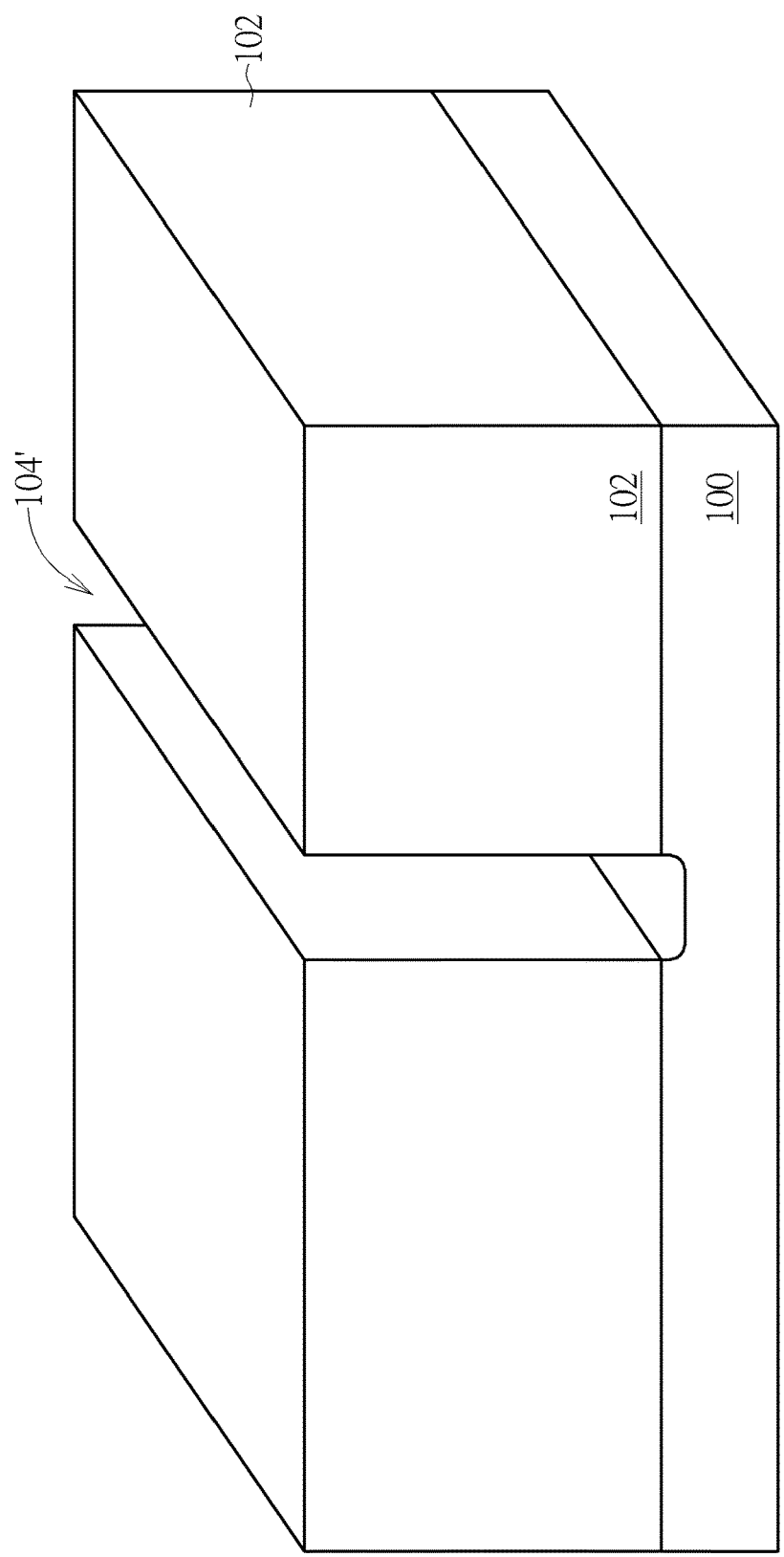

Please refer to FIG. 2, which is a schematic drawing illustrating a modification the present invention. According to the modification, the dry etching process used to remove the semiconductor substrate 100 in between the dielectric structure 102 can be performed to over-etch the semiconductor substrate 100. Therefore, a bottom of an over-etched recess 104' is lower than the bottom of the dielectric structure 102 as shown in FIG. 2.

Figure 3:
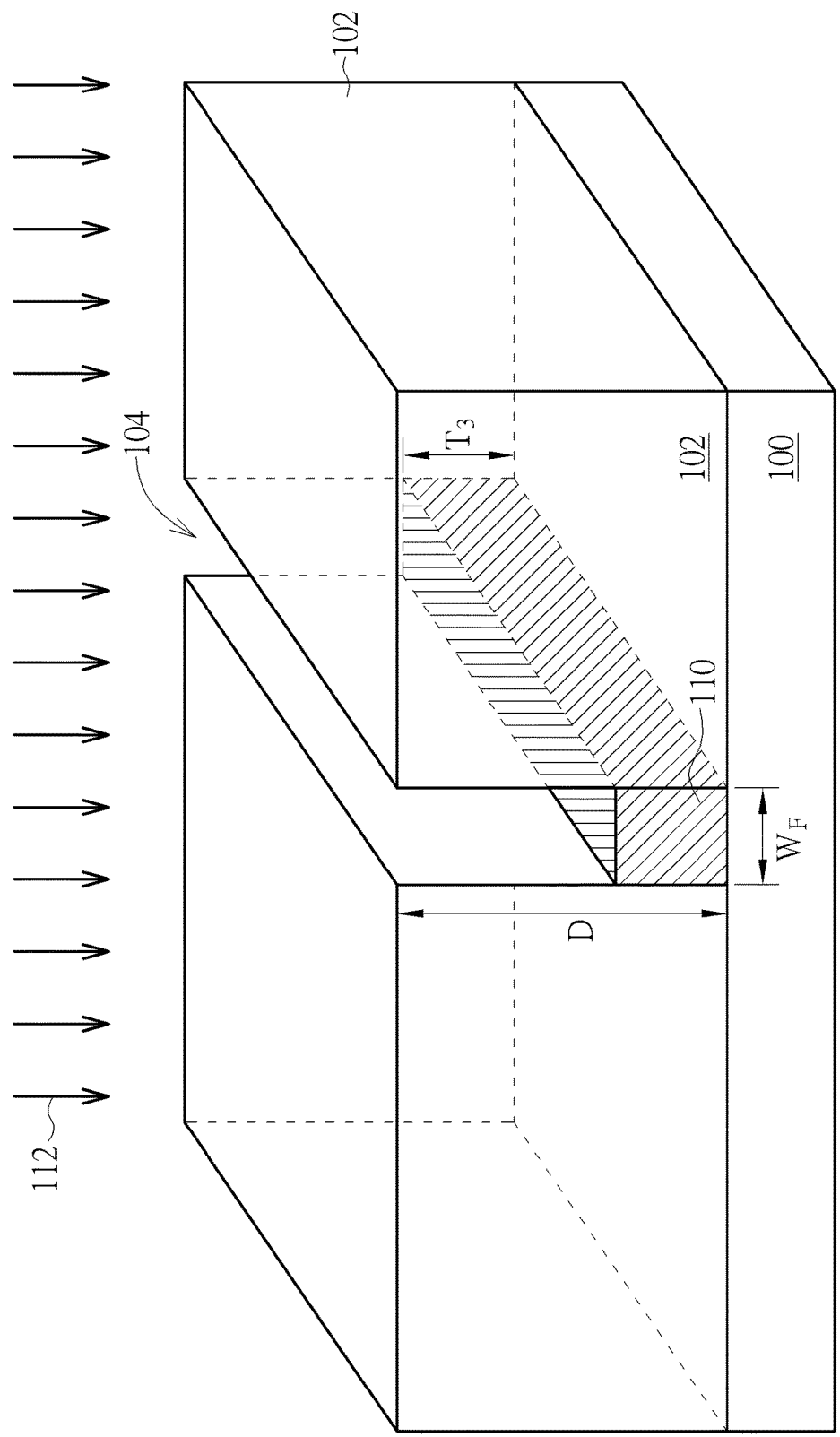

Please refer to FIG. 3. After forming the recess 104/104', an epitaxial layer 110 is formed in the recess 104/104'. In some embodiments of the present invention, the epitaxial layer 110 can be formed by performing a SEG process, but not limited to this. The epitaxial layer 110 includes the aforementioned first semiconductor material and a second semiconductor material, and a lattice constant of the second semiconductor material is different from a lattice constant of first semiconductor material. In some embodiments of the present invention, the second semiconductor material can be Ge. Preferably, the lattice constant of the second semiconductor material is larger than the lattice constant of first semiconductor material. The second semiconductor material in the epitaxial layer 110 includes a third concentration (that is the Ge concentration), and the third concentration is between 0% and 50%. The third concentration of the second semiconductor material in the epitaxial layer 110 can be upwardly increased or graded from 0% to 50% in some embodiments of the present invention. Or, the third concentration of the second semiconductor material in the epitaxial layer 110 can be predetermined and fixed to 30% in some embodiments of the present invention. It should be easily realized that the third concentration can be predetermined according to different product requirements. It is noteworthy that the epitaxial layer 110 is an undoped epitaxial layer. That is, the epitaxial layer 110 includes no conductive dopants. Therefore, the epitaxial layer 110 is an intrinsic SiGe layer. Furthermore, the epitaxial layer 110 includes a thickness T3, and the thickness T3 is one-third to a half of the depth D of the recess 104. In some embodiments of the present invention, for example but not limited to, the depth D of the recess 104 is 100 nm and the thickness T3 of the epitaxial layer 110 is 30 nm-50 nm.

Please still refer to FIG. 3. After forming the epitaxial layer 110, a thermal treatment 112 can be directly performed to reduce defect(s) that might be formed in the epitaxial layer 110. It is noteworthy that no gas is involved in the thermal treatment 112.

Figure 4:
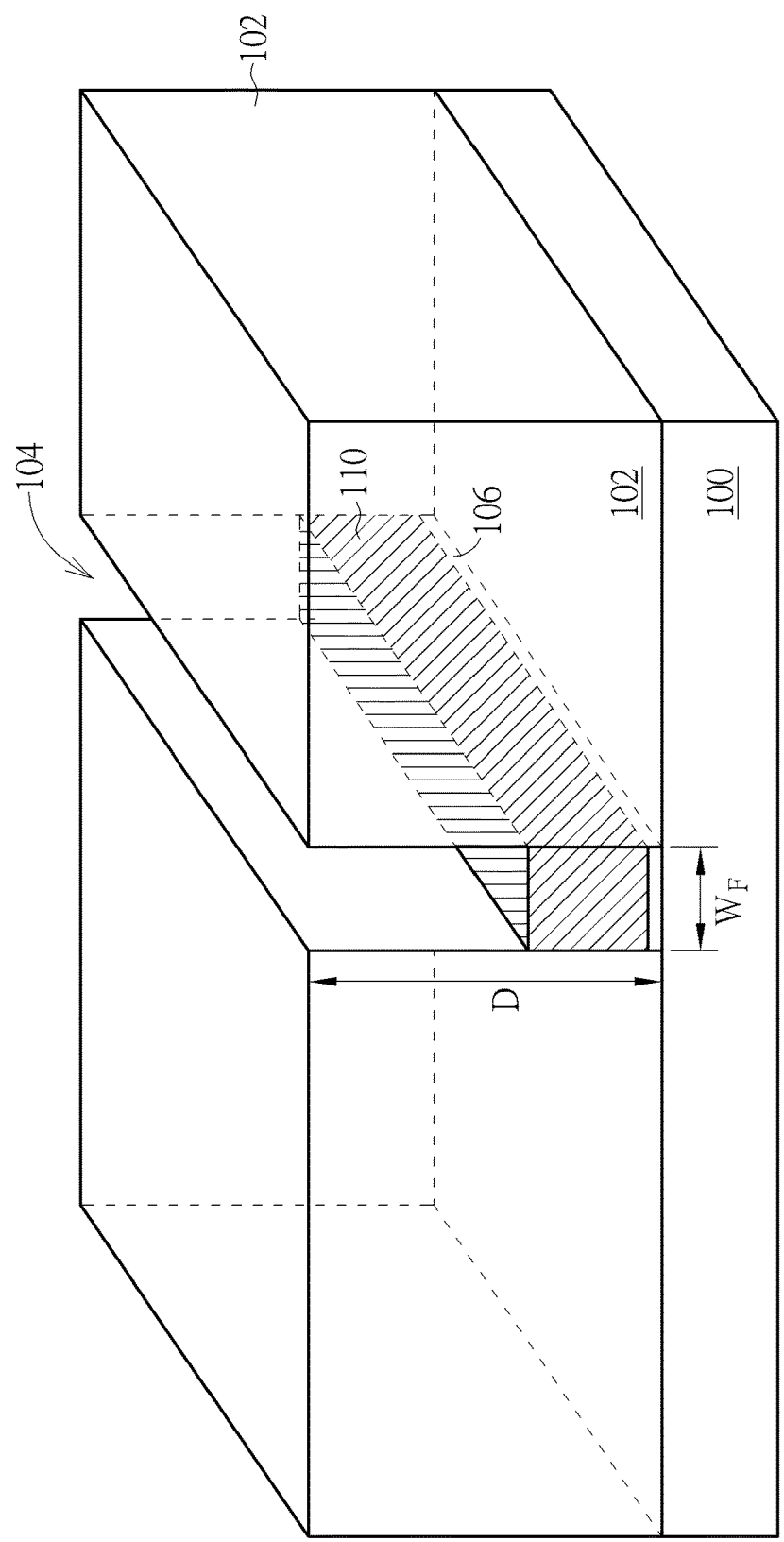

Please refer to FIG. 4, which is a schematic drawing illustrating another modification the present invention. According to the present modification, a thin epitaxial layer 106 is formed in the recess 104 before forming the epitaxial layer 110. In some embodiments of the present invention, the thin epitaxial layer 106 can be formed by performing a SEG process, but not limited to this. The epitaxial layer 106 includes material the first semiconductor material, that is Si in the preferred embodiment. As shown in FIG. 4, the epitaxial layer 110 is then formed on the epitaxial layer 106. The epitaxial layer 106 and the epitaxial layer 110 can be in-situ formed, but not limited to this. It is noteworthy that the epitaxial Si layer 106, which includes the same silicon material with the semiconductor substrate 100, is formed to provide a better growing place for the to-be-formed epitaxial layer 110. Accordingly, the epitaxial SiGe layer 110 is grown from a superiorly suitable epitaxial Si surface and thus the growth result of the epitaxial layer 110 is improved.

Figure 5:
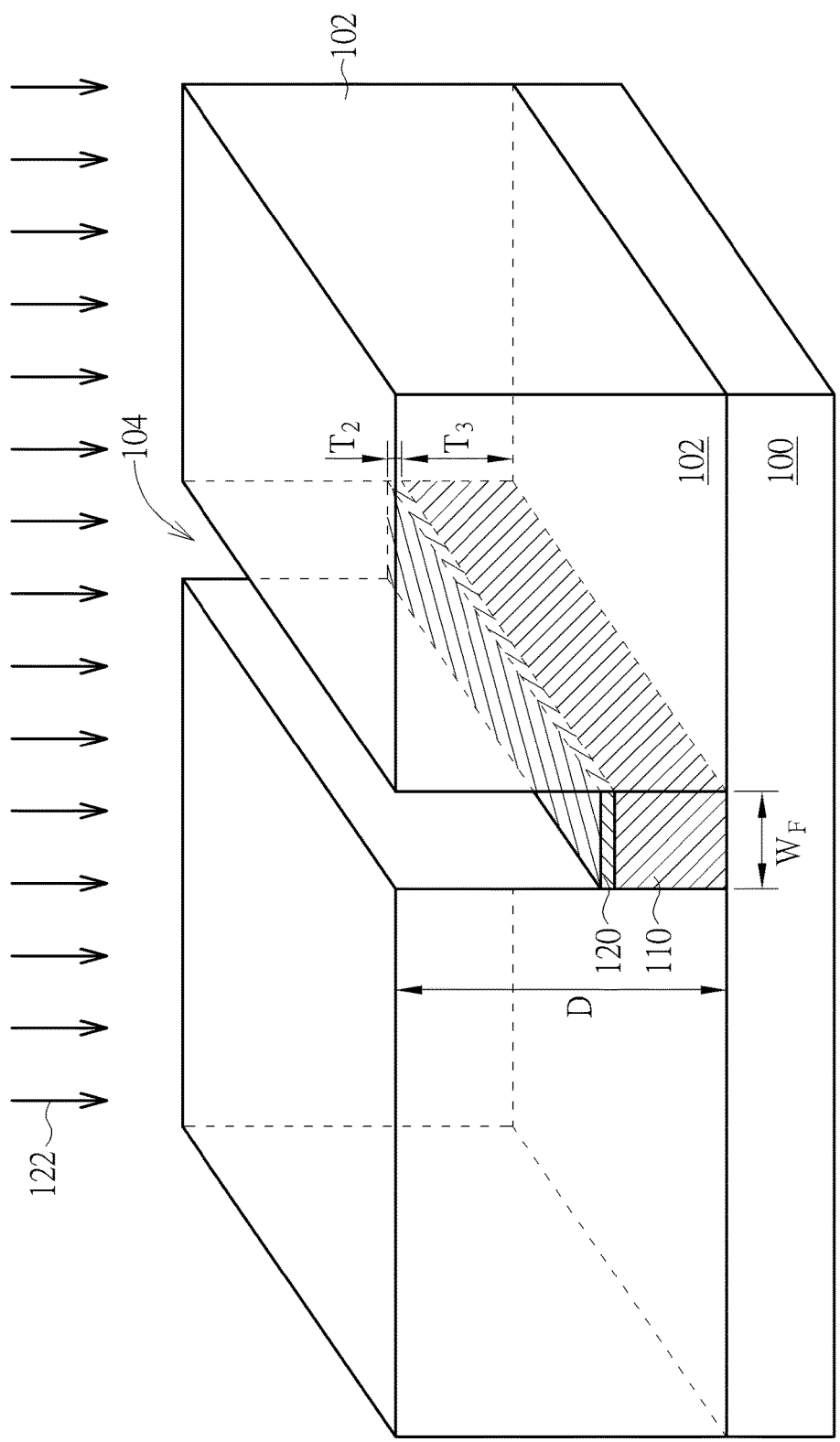

Please refer to FIG. 5. After forming the epitaxial layer 110, an epitaxial layer 120 is formed on the epitaxial layer 110. In some embodiments of the present invention, the epitaxial layer 120 can be formed by performing a SEG process, but not limited to this. And the epitaxial layer 110 and the epitaxial layer 120 can be in-situ formed, but not limited to this. The epitaxial layer 120 includes the aforementioned first semiconductor material and second semiconductor material. That is, the epitaxial layer 120 includes SiGe. The second semiconductor material in the epitaxial layer 120 includes a second concentration, and the second concentration is equal to or larger than the third concentration. Furthermore, epitaxial layer 120 includes a thickness T2, and the thickness T2 is one-tenth of the depth D of the recess 104. In some embodiments of the present invention, for example but not limited to, the depth D of the recess 104 is 100 nm and the thickness T2 of the epitaxial layer 120 is 10 nm. It is noteworthy that the epitaxial layer 120 includes conductive dopants, and the conductive dopants can be doped by any suitable process such as co-implant, but not limited to this. More important, a conductivity type the conductive dopants in the epitaxial layer 120 is complementary to that of the transistor device to be formed. Particularly speaking, when the to-be-formed semiconductor structure serves as an element of an n-typed transistor, the conductive dopants in the epitaxial layer 120 include p-typed dopants such as boron (B). Alternatively, when the to-be-formed semiconductor structure serves as an element of a p-typed transistor, the conductive dopants in the epitaxial layer 120 include n-typed dopants such as phosphorous (P) or arsenic (As). Briefly speaking, the conductivity type of the epitaxial layer 120 is complementary to that of the to-be-formed transistor. In some embodiments of the present invention, a concentration of the conductive dopants in the epitaxial layer 120 is lower than $1E19/cm^3$. In some embodiments of the present invention, a concentration of the conductive dopants is preferably between $5E18/cm^3$ and $1E19/cm^3$, but not limited to this.

Please still refer to FIG. 5. After forming the epitaxial layer 120, a thermal treatment 122 is performed to drive the implanted conducive dopants into the epitaxial layer 120. It is noteworthy that hydrogen or nitrogen gas can be introduced to the thermal treatment 122.

Figure 6:
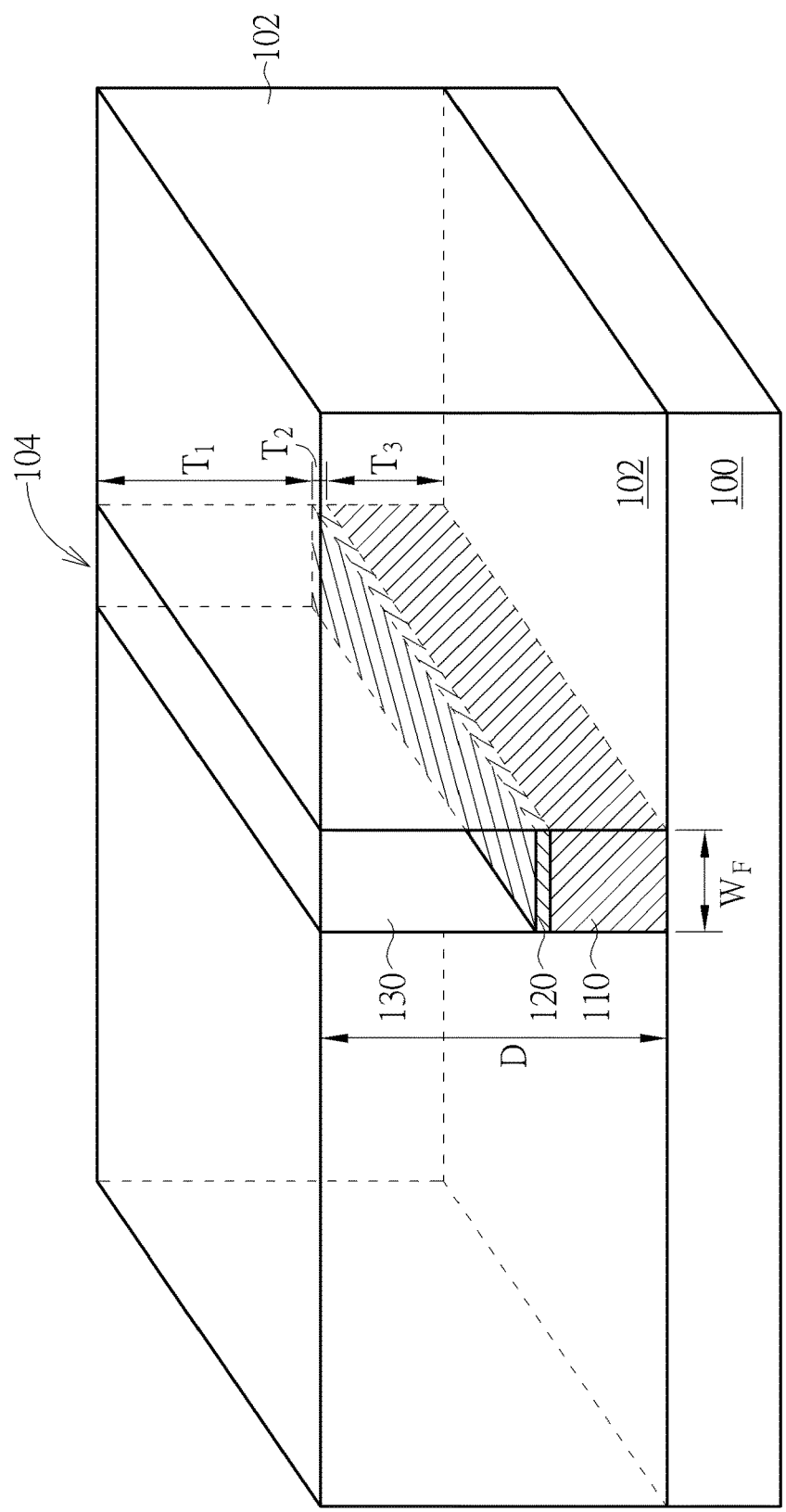

Please refer to FIG. 6. After forming the epitaxial layer 120, an epitaxial layer 130 is directly formed on the epitaxial layer 120. In some embodiments of the present invention, the epitaxial layer 130 can be formed by performing a SEG process, but not limited to this. And the epitaxial layer 110, the epitaxial layer 120 and the epitaxial layer 130 can be in-situ formed, but not limited to this. The epitaxial layer 130 includes a thickness T1, and the thickness Ti is one-third to a half of the depth D of the recess 104. It is therefore concluded that the thickness T2 of the epitaxial layer 120 is smaller than the thickness T3 of the epitaxial layer 110 and the thickness T1 of the epitaxial layer 130. More important, the recess 104 is filled up with the epitaxial layer 130 as shown in FIG. 6. The epitaxial layer 130 includes the aforementioned first semiconductor material and second semiconductor material. That is, the epitaxial layer 130 includes SiGe. The second semiconductor material in the epitaxial layer 130 includes a first concentration, and the first concentration is equal to or larger than the second concentration. In some embodiments of the present invention, for example but not limited to, the first concentration of the second semiconductor material in the epitaxial layer 130 is between 30% and 70%. In some embodiments of the present invention, the first concentration of the second semiconductor material in the epitaxial layer 130 even can be 100%. It is also noteworthy that the epitaxial layer 130 is an undoped epitaxial layer. That is, the epitaxial layer 130 includes no conductive dopants. Therefore, the epitaxial layer 130 is an intrinsic SiGe layer.

Figure 7:
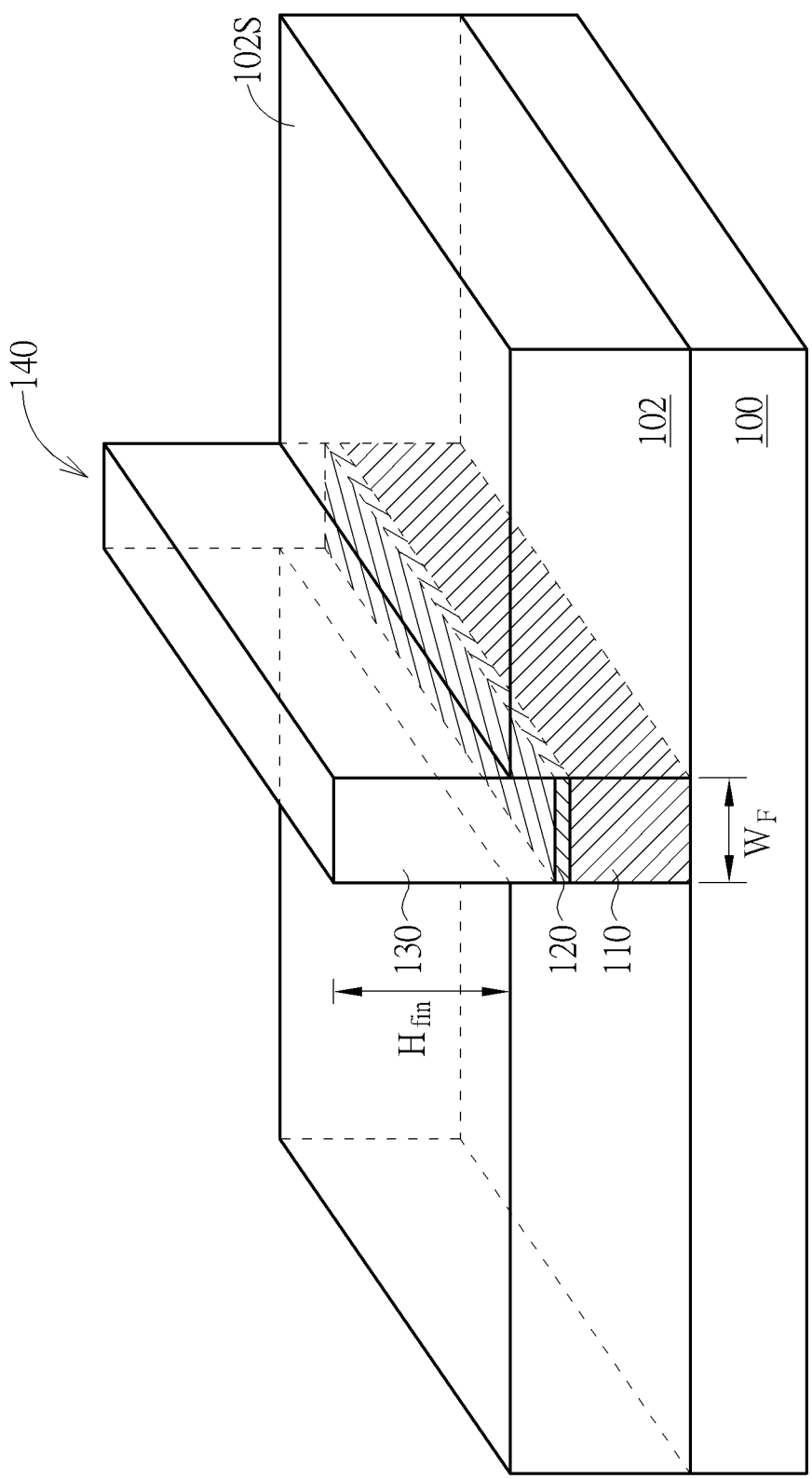

Please refer to FIG. 7. After forming all epitaxial layers (110/120/130), an etching back process is performed to remove a portion of the dielectric structure 102. Consequently, a portion of the epitaxial layer 130 is protruded from a surface 102S of the dielectric structure 102. And thus a fin 140 is formed in the dielectric structure 102 on the semiconductor substrate 100. Accordingly, the fin 140 includes the undoped epitaxial layer 110, the epitaxial layer 120 including the conductive dopants and the undoped the epitaxial layer 130. As mentioned above, in some modifications to the present invention, an undoped thin epitaxial layer 106 which includes the same silicon material as the semiconductor substrate can be formed in between the semiconductor substrate 102 and the undoped epitaxial layer 110 of the fin 140. As shown in FIG. 7, the fin 140 is protruded from a surface 102S of the dielectric structure 102, and thus a protruded height $H_{Fin}$ is defined between a top surface of the fin 140 and the surface 102S of the dielectric structure 102. Typically, the protruded height $H_{Fin}$ is also defined as the fin height. In some embodiments of the present invention, the fin height $H_{Fin}$ is between 20 nm and 50 nm, but not limited to this.

Figure 8:
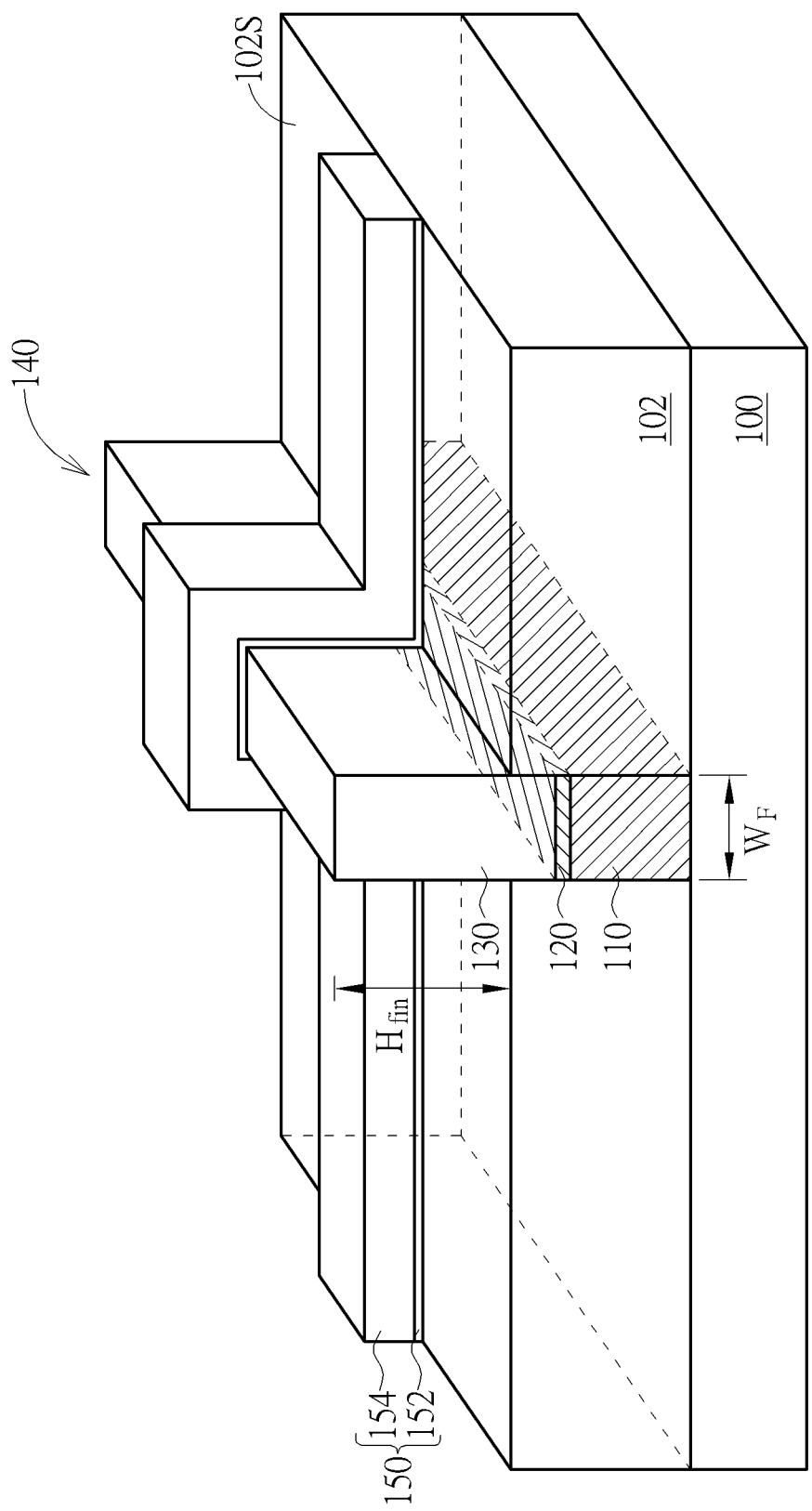

Please refer to FIG. 8. Next, a gate dielectric layer 152 and a gate conductive layer 154 are sequentially formed on the semiconductor substrate 100, particularly on the dielectric structure 102 and the fin 140. The gate dielectric layer 152 and the gate conductive layer 154 are then patterned to form a gate layer 150 on the fin 140. As shown in FIG. 8, an extending direction of the gate layer 150 is perpendicular to an extending direction of the fin 140. And the gate layer 150 covers a portion of the fin 140. In some embodiments of the present invention, the gate dielectric layer 152 can include the conventional dielectric material such as silicon oxide (SiO), silicon nitride (SiN), or silicon oxynitride (SiON). In some embodiments of the present invention, the gate dielectric layer 152 can further include high-K dielectric material such as hafnium oxide (HfO), hafnium silicate (HfSiO), or metal oxide or metal silicate exemplarily of aluminum (Al), zirconium (Zr), lanthanum (La), but not limited to this. In addition, when the gate dielectric layer 152 of the preferred embodiment adopts the high-K dielectric material, the present invention can be further integrated to the metal gate process. Therefore control gate compatible to the high-K gate dielectric layer is obtained. Accordingly, the gate conductive layer 154 can include different materials according to the gate-first or gate-last process. In some embodiments of the present invention integrated to the gate-first process, the gate conductive layer 154 includes metal such as tantalum (Ta), titanium (Ti), ruthenium (Ru), molybdenum (Mo), alloys of the aforementioned metals such as titanium al titanium aluminide (TiAl), metal nitride such as tantalum nitride (TaN), titanium nitride (TiN), molybdenum nitride (MoN), or metal carbide such as tantalum carbide (TaC). It is noteworthy that the metals are chosen by providing proper work function to the multi-gate transistors of different conductivity types. And the gate conductive layer 154 can be a single-layered or multi-layered structure. In some embodiments of the present invention integrated to the gate-last process, the gate conductive layer 154 serves as a dummy gate and includes semiconductor material such as polysilicon. It is noteworthy that the conductivity type of the gate conductive layer 154 is the same with that of the to-be-formed transistor, therefore the conductivity type of the gate conductive layer 154 is complementary to the conductivity type of the epitaxial layer 120.

Please refer to FIG. 8 again. According to the semiconductor structure provided by the preferred embodiment, a fin 140 is formed on the semiconductor substrate 100. The fin 140 includes the undoped epitaxial layer 110, the undoped epitaxial layer 130 and the epitaxial layer 120 sandwiched in between the undoped epitaxial layers 110 and 130 while the epitaxial layer 120 includes the conductive dopants. Since channel region of an FinFET device is to be formed in the epitaxial layer 130 of the fin 140, the first concentration of the second semiconductor material in the epitaxial layer 130 includes a target concentration such as 30%-70%, even to 100%. And the first concentration can be upwardly increased or graded. Thus, a SiGe channel or a Ge channel is provided by the embodiments of the present invention. Furthermore, the second concentration of the second semiconductor material in the epitaxial layer 120, which is sandwiched in between the epitaxial layer 130 and the epitaxial layer 110, is smaller than the first concentration of the second semiconductor material in the epitaxial layer 130. However, the epitaxial layer 120 includes the conductive dopants having conductivity type complementary to the to-be-formed FinFET device. Therefore the epitaxial layer 120 formed under the epitaxial layer 130 (where the channel region is formed) serves as anti-punch through (hereinafter abbreviated as APT) layer. Additionally, the third concentration of the second semiconductor material in the epitaxial layer 110, which is formed in between the semiconductor substrate 100 and the epitaxial layers 120/130, is smaller than the first and second concentration of the second semiconductor material in the epitaxial layer 120/130. That is, the Ge concentration of the second semiconductor material in the epitaxial layer 110 is between the Ge concentration of the epitaxial layer 120/130 and the Ge concentrations of the semiconductor substrate 100. Therefore, the epitaxial layer 110 serves as a strain relaxed buffer (hereinafter abbreviated as SRB) layer. Consequently, any dislocation defect formed in the fin 140 due to the lattice mismatch between the semiconductor substrate 100 and the fin 140 is confined within the epitaxial SRB layer 110. Additionally, the epitaxial layer 110 provides a suitable surface for growing the epitaxial layers 120/130, and thus the epitaxial layer 120 serving as the APT layer and the epitaxial layer 130 for forming the channel region are formed without disclocation defects.

According to the semiconductor structure and the manufacturing method thereof provided by the present invention, at least a second epitaxial layer is formed before forming the first epitaxial layer, which serves as the main stress provider. The second epitaxial layer further includes the conductive dopants which having the conductivity type complementary to the transistor device to be formed. Consequently, the second epitaxial layer serves as an APT layer. Furthermore, another epitaxial layer is formed between the abovementioned two epitaxial layers and the substrate for serving as an SRB layer. Therefore, any dislocation defect is confined the SRB layer, and thus the growth results of the epitaxial APT layer and the stress-provider epitaxial layer are improved. Briefly speaking, according to the semiconductor structure and the manufacturing method thereof provided by the present invention, the first epitaxial layer is provided to render stress to the final transistor, the second epitaxial layer including the conductive dopants is provided to avoid punch through effect, and the undoped third epitaxial layer is provided to be the SRB layer. Therefore the performance of the transistor device including those epitaxial layers is efficaciously improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure comprising:
   a semiconductor substrate comprising a first semiconductor material;
   a dielectric structure formed on the semiconductor substrate, directly contacting an upper surface of the semiconductor substrate and comprising at least a recess penetrating through the whole thickness of the dielectric structure ; and
   a fin formed in the recess, the fin comprising:
      a first epitaxial layer comprising the first semiconductor material and a second semiconductor material, a lattice constant of the second semiconductor material being different from a lattice constant of the first semiconductor material, wherein the first epitaxial layer is a single layer in its entirety;
      a second epitaxial layer formed between the first epitaxial layer and the semiconductor substrate, the second epitaxial layer comprising the first semiconductor material and the second semiconductor material and being a single layer in its entirety, and the second epitaxial layer further comprising conductive dopants, wherein the first epitaxial layer directly contacts a top surface of the second epitaxial layer;
      a third epitaxial layer formed between the second epitaxial layer and the semiconductor substrate and directly contacting the upper surface of the semiconductor substrate, the second epitaxial layer directly contacting a top surface of the third epitaxial layer, the third epitaxial layer being a single layer in its entirety and comprising the first semiconductor material and the second semiconductor material and being an undoped epitaxial layer comprising no conductive dopants, wherein the first epitaxial layer, the second epitaxial layer and the third epitaxial layer have sidewalls completely aligned along an extending direction of the fin, wherein a concentration of the second semiconductor material in the first epitaxial layer is larger than a concentration of the second semiconductor material in the second epitaxial layer, and the concentration of the second semiconductor material in the second epitaxial layer is larger than a concentration of the second semiconductor material in the third epitaxial layer; and
   a gate layer formed on the dielectric structure and striding across the fin, wherein the gate layer is a conformal layer having a substantially uniform thickness disposed on the dielectric structure and the first epitaxial layer, respectively, wherein a top surface of the second epitaxial layer is below a top surface of the dielectric structure and a bottom surface of the gate layer along an extending direction of the gate layer, and a bottom surface of the first epitaxial layer is below the top surface of the dielectric structure along the extending direction of the gate layer, wherein a thickness of the second epitaxial layer is one-tenth of a height of the fin and is smaller than a thickness of the first epitaxial layer and a thickness of the third epitaxial layer, wherein the gate layer comprises a first conductivity type and the conductive dopants in the second epitaxial layer comprises a second conductivity type complementary to the first conductivity type.

2. The semiconductor structure according to claim 1, wherein the first conductivity type is an n type, and the conductive dopants comprise boron (B).

3. The semiconductor structure according to claim 1, wherein the first conductivity type is a p type, and the conductive dopants comprise phosphorous (P) or arsenic (As).

4. The semiconductor structure according to claim 1, wherein the conductive dopants in the second epitaxial layer comprises a concentration, and the concentration is smaller than $1E19/cm^3$.

5. The semiconductor structure according to claim 1, wherein the second epitaxial layer is sandwiched between the first epitaxial layer and the third epitaxial layer.

6. A semiconductor structure comprising:
   a semiconductor substrate comprising a first semiconductor material;
   a dielectric structure formed on the semiconductor substrate, directly contacting an upper surface of the semiconductor substrate and comprising at least a recess penetrating through the whole thickness of the dielectric structure ; and
   a fin formed in the recess, the fin comprising:
      a first epitaxial layer comprising the first semiconductor material and a second semiconductor material, a lattice constant of the second semiconductor material being different from a lattice constant of the first semiconductor material, wherein the first epitaxial layer is a single layer in its entirety;
      a second epitaxial layer formed between the first epitaxial layer and the semiconductor substrate, the second epitaxial layer comprising the first semiconductor material and the second semiconductor material and being a single layer in its entirety, and the second epitaxial layer further comprising conductive dopants, wherein the first epitaxial layer directly contacts a top surface of the second epitaxial layer;

a third epitaxial layer formed between the second epitaxial layer and the semiconductor substrate and directly contacting the upper surface of the semiconductor substrate, the second epitaxial layer directly contacting a top surface of the third epitaxial layer, the third epitaxial layer being a single layer in its entirety and comprising the first semiconductor material and the second semiconductor material, wherein the first epitaxial layer, the second epitaxial layer and the third epitaxial layer have sidewalls completely aligned along an extending direction of the fin, wherein the second epitaxial layer directly contacts a top surface of the third epitaxial layer, wherein a concentration of the second semiconductor material in the first epitaxial layer is larger than a concentration of the second semiconductor material in the second epitaxial layer, and the concentration of the second semiconductor material in the second epitaxial layer is larger than a concentration of the second semiconductor material in the third epitaxial layer; and a gate layer formed on the dielectric structure and striding across the fin, wherein the top surface of the second epitaxial layer is below a top surface of the dielectric structure and a bottom surface of the gate layer along an extending direction of the gate layer, and a bottom surface of the first epitaxial layer is below the top surface of the dielectric structure along the extending direction of the gate layer, wherein the third epitaxial layer has a dislocation defect, wherein the second epitaxial layer and the third epitaxial layer respectively have no dislocation defect in an entirety thereof.

* * * * *